United States Patent [19]
Johnson et al.

[11] 4,270,263
[45] Jun. 2, 1981

[54] GLASS SUPPORT LIGHT ENERGY CONVERTER

[75] Inventors: Elwin L. Johnson; Jack S. Kilby, both of Dallas, Tex.; Jay W. Lathrop, Clemson, S.C.; John S. McFerren, Dallas; David J. Myers, Plano, both of Tex.

[73] Assignee: Texas Instruments Incorporated, Dallas, Tex.

[21] Appl. No.: 932,671

[22] Filed: Aug. 10, 1978

Related U.S. Application Data

[62] Division of Ser. No. 768,187, Feb. 14, 1977, Pat. No. 4,173,494.

[51] Int. Cl.³ .............................................. H01L 7/24
[52] U.S. Cl. ...................................................... 29/590
[58] Field of Search ......................... 29/572, 589, 590

[56] References Cited

U.S. PATENT DOCUMENTS

| | | | |
|---|---|---|---|
| 3,247,477 | 4/1966 | Fridrich | 338/15 |
| 3,998,659 | 12/1976 | Wakefield | 29/572 |
| 4,021,323 | 5/1977 | Kilby | 29/572 |

*Primary Examiner*—Donald L. Walton
*Attorney, Agent, or Firm*—Richards, Harris & Medlock

[57] ABSTRACT

Semiconductor particles are distributed in a single level layer orientation in a glass sheet with portions of each particle exposed at both surfaces of the sheet. A metal layer on one surface of the sheet is in ohmic contact with the body of each particle and forms a common electrode.

8 Claims, 14 Drawing Figures

GLASS SUPPORT LIGHT ENERGY CONVERTER

This is a division of application Ser. No. 768,187, filed Feb. 14, 1977, now U.S. Pat. No. 4,173,494.

The invention involves the utilization as a single layer, small particles of semiconductor material, particles preferably spherical in shape, assembled to provide useful devices such as solar cells, L.E.D. displays and the like.

In U.S. Pat. No. 4,021,323 (copending application Ser. No. 599,473, filed July 28, 1975) assigned to the assignee of the present application, several embodiments of a radiant energy converter are disclosed. The present application describes an improved method of fabrication of some of the structures of said U.S. Pat. No. 4,021,323.

In an embodiment disclosed in U.S. Pat. No. 4,021,323, semiconductor particles are provided with diffused layers to form individual solar cells. Although the particles may be of any shape, a spherical form has been found advantageous. The output of these cells is used to electrolyze various solutions. For some solutions the voltage produced by a single cell is sufficient, while for others two or more cells are connected in series to achieve the desired voltage level.

In accordance with the present invention, such cells are cast as a single layer in a glass matrix which is fused to provide a structure in which surfaces of the spheres are exposed on opposite sides of the layer. The structure thus provided is processed to apply a metallic layer to one side of the structure in electrical contact with one portion of all of the spheres. For solar cell devices, transparent electrodes are then provided to the opposite exposed surface of each individual sphere.

When thus completed, the single layer array may be immersed in a suitable electrolyte. Current flows in response to light radiation incident on the spheres through the transparent electrodes.

As disclosed in said U.S. Pat. No. 4,021,323, a radiant energy converter preferably involves an electrolyte of hydrogen iodide. In such case hydrogen gas will be liberated, collected and stored or otherwise utilized. Preferably, such converters would be used in a closed system with the hydrogen and iodine being recombined in a fuel cell so that there is in a single operative unit the facility for (a) the conversion of light energy into electrical current which flows in an electrolyte for the dissociation of electrolyte components and (b) recombination of the dissociated components for generation of electrical current on a demand basis from the stored dissociated products of the initial reaction.

Thus, in accordance with the present invention, an array of semiconductor bodies is provided which comprises semiconductor particles each having a body fused in a glass layer with each of the particles exposed at both of the opposite sides of the sheet. A metal layer on one side of the sheet contacts the body portions of all of the particles.

The novel features believed characteristic of the invention are set forth in the appended claims.

The invention itself, however, as well as further objects and advantages thereof, will best be understood by reference to the following detailed description of an illustrative embodiment taken in conjunction with the accompanying drawings, in which.

The present invention as to one embodiment is directed to the production of an array of semiconductor particles each having a surface layer of one conductivity type and a body of the opposite conductivity type cast in a single layer orientation in a sheet of glass. Some of the particles have a body of p-type material. Others of the particles have a body of n-type material. One surface of each particle is exposed at one surface of the sheet. A metal layer on the other surface of the sheet is then laid down in electrical contact with the body of all the particles. Articles of this construction are particularly adaptable for use in the conversion of solar or light energy.

In said U.S. Pat. No. 4,021,323, a method is disclosed for forming such articles. Substantial improvements are achieved by the present invention. The particles are distributed in a slurry of glass which is then cast as a thin layer. The particles are located at spaced apart points in the sheet with the thickness of the sheet slightly less than the diameter of the particles. The matrix with the particles therein is then fired to densify and fuse the glass. In the process, the matrix initially about as thick as the particle diameter becomes thinned in the zone between the semiconductor particles so that the semiconductor particles normally protrude from the surfaces of the glass sheet. The sheet is then treated so that on one side the surface layer is removed to expose the body of the material of each particle. Where the particles have a PN junction thereon, the junction is then protected and a metal layer is applied to contact the bodies of all the particles to provide an electrical terminal common to all particles. A transparent metal electrode may be formed individually over each particle on the opposite side of the sheet.

Figure 1:
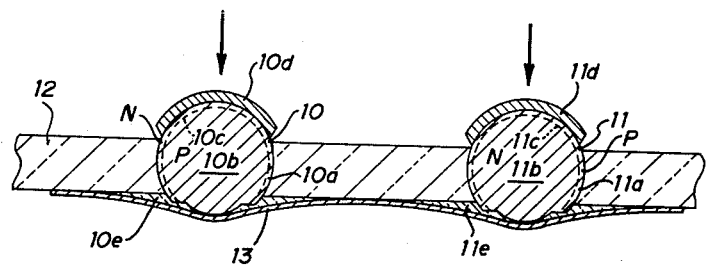
FIG. 1 is a sectional view through a light converter of the present invention with two spheres being shown.

A representative example of a radiant energy converter produced in accordance with the present invention is illustrated in FIG. 1. Two spherical semiconductor spheres 10 and 11 are shown. Sphere 10 has an N outer layer 10a and a P body portion 10b with a PN junction 10c. Sphere 11 is similar, having a P surface layer 11a and an N body 11b, with an NP junction 11c. Spheres 10 and 11 are fixed in a glass matrix, a layer 12 of glass particles fused with the spheres 10 and 11 in place. A transparent surface electrode 10d is formed on sphere 10 and a like electrode 11d is formed on sphere 11. Both spheres are etched at a location opposite electrodes 10d and 11d to depths below the junctions 10c and 11c to expose the body portions 10b and 11b. A glass layer on ring 10e is provided to protect the junction as it is exposed on the sphere 10. A glass layer or ring 11e similarly protects the junction 11c. A common metal conductor 13 covers the bottom surface of the glass layer and forms a common electrical contact with the bodies 10b and 11b and all similar spheres that are present in the layer 12.

Only two such spheres 10 and 11 have been shown in FIG. 1 for the purpose of illustrating the basic structure involved. It will be understood that sheet 12 may have many spheres fused therein in a fixed pattern or dispersed at random. The spheres 10 and 11 will be of the order of 0.015 inch in diameter. The sheet 12 will be of the order of 0.010 inch thick. Sphere density will be selected to optimize utilization of incident light energy.

Structures such as shown in FIG. 1 are the object of the procedures now to be described.

Figure 2:
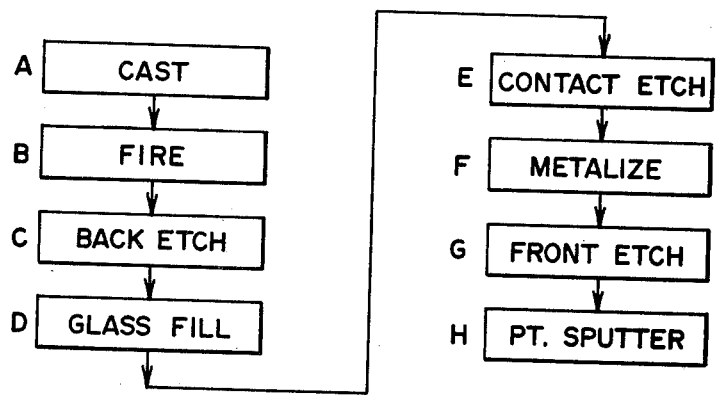
FIG. 2 is a process flow diagram illustrative of the production of a unit of FIG. 1.

In FIG. 2, the steps leading to the structure of FIG. 1 are set out in the preferred sequence.

Step A involves casting a thin layer of a viscous glass slurry on a flat surface with the spheres of NP and PN conductivity types mixed in the slurry in about equal amounts and in total volume adequate to provide a desired density of particles in a finished layer.

In step B, the layer of glass slurry with the spheres therein are placed in a furnace and fired to densify and fuse the glass slurry.

In step C, the sheet is then provided with a protective mask on one face thereof. It is then contacted with an etchant so that the spheres on the face of the sheet opposite the mask are exposed by etching the densified glass. The spheres are then etched to expose the junctions 10c and 11c, FIG. 1.

In step D, a glass fill is provided, i.e., glass material is applied and is fired to overlay the exposed junctions 10c and 11c on the etched side of layer 12.

In step E, the glass rings 10e and 11e are etched sufficient to expose the bodies 10b and 11b but not sufficient to expose the junctions 10c and 11c.

In step F, the back metal contact layer 13 is laid down.

In step G, the side of the structure opposite the metal layer 13 is etched to remove any oxides and to provide a contact area for the surface layers 10a and 11a.

In step H, an electrode layer is deposited from which the electrodes 10d and 11d ultimately are established. The portions of that layer connecting areas between the spheres 10 and 11 is etched away leaving only the electrodes 10d and 11d covering spheres 10 and 11, respectively.

In this form, the spheres 10 and 11 are complete diodes with the electrode 13 common to the bodies of all of the spheres and with electrodes 10d and 11d isolated one from another.

As described in said application Ser. No. 599,473, light converters in sheet form of substantial area and containing hundreds or thousands of spheres may then be placed in a reactor, typically a reactor filled with hydrogen iodide, and exposed to light energy such as represented by sun's rays, for example. Current then flows through the hydrogen iodide between diodes of opposite conductivity types. The voltages are adequate to electrolyze the hydrogen iodide, producing hydrogen gas and iodine. These components may then be stored or utilized as explained in said application Ser. No. 599,473.

The following is a more detailed description of the steps above enumerated but in somewhat greater detail.

Step A—Casting

Preparatory to casting, it has been found desirable to size the semiconductor spheres. Sphere production as presently controlled results in variations in sphere size. Thus, a screening step is first employed so that collections of spheres of substantially uniform size may be employed. Further in preparation for casting, a glass slurry is compounded. A suitable slurry may be of the type which comprises glass powder manufactured and sold by Corning Glass Co., Corning, N.Y., and identified as Type 7052, which in powder form is smaller than 325 mesh. The glass powder is mixed with a binder and a solvent to form a viscous slurry. A suitable solvent is of the type of methylethyl ketone (MEK). A binder found to be suitable is formed of a mixture of two materials, the first of which is a binder B-50, manufactured and sold by Rohm & Haas, Philadelphia, Pa. and identified as ethylmethylmethacrylate, and a plasticizer G-30, also sold by Rohm & Haas. Suitable proportions for the slurry are set out in Table I.

TABLE I

| 7052 glass powder | 1000 grams |
|---|---|
| B-50 | 300 grams |
| G-30 | 180 grams |
| MEK | 200 grams |

To the foregoing slurry, there is added about equal quantities of PN spheres and NP spheres which are then thoroughly distributed and dispersed throughout the slurry. Preferably, for a solar energy conversion application as contemplated in FIG. 1, spheres in the amount of about 4 grams of each of the two sphere types would be added to each 16 milliliters of glass slurry. This provides a suitable density of spheres such as spheres 10 and 11 in the resultant sheet. Preferably, the slurry has a viscosity of from 3 to 10 units (Brookfield Model HVT, No. 4 spindle, 20 r.p.m.).

The slurry is then cast as a thin layer on a planar backing sheet. A suitable sheet has been found to be a synthetic sheet of material commonly available under the trade name Celenar ®. Sheets of about 1.5 mil thickness overlay a flat sheet of glass. Typical is the operation illustrated in FIG. 3 wherein slurry with spheres distributed therein is supplied through funnel 20. Sheet 25 from a roll 21 passes over an idler roll 22 and across the surface of a glass plate 23. Sheet 25 passes beneath the edge of a doctor blade 24. As sheet 25 passes the doctor blade 24, it carries with it a monolayer of spheres distributed in a sheet 26 of the glass slurry.

Sheet 26 thus cast is dried at room temperature for a period such as 16 hours after which it is stripped from sheet 25 preparatory to firing sheet 26.

Step B—Firing

Sheet 26, once dried and stripped from sheet 25, is then placed in an oven in order to complete the drying. It has been found than an oven maintained at 130° C. for two hours and then at 175° C. for 18 hours completes the drying process for sheet 26.

Thereafter, the dried sheet 26 is suitably fired as by placing it in a chain furnace in which the travel is three inches per minute and in which the temperature peaks at 800° C. A typical furnace suitable for firing has a temperature profile, which beginning at room temperature increases slowly to the 800° C. peak and then decreases slowly back to room temperature. A suitable furnace is of the type manufactured and sold by Lindberg, Watertown, Wisc. and identified as Model No. 47-HC-9722-20AMC-36.

Figure 3:
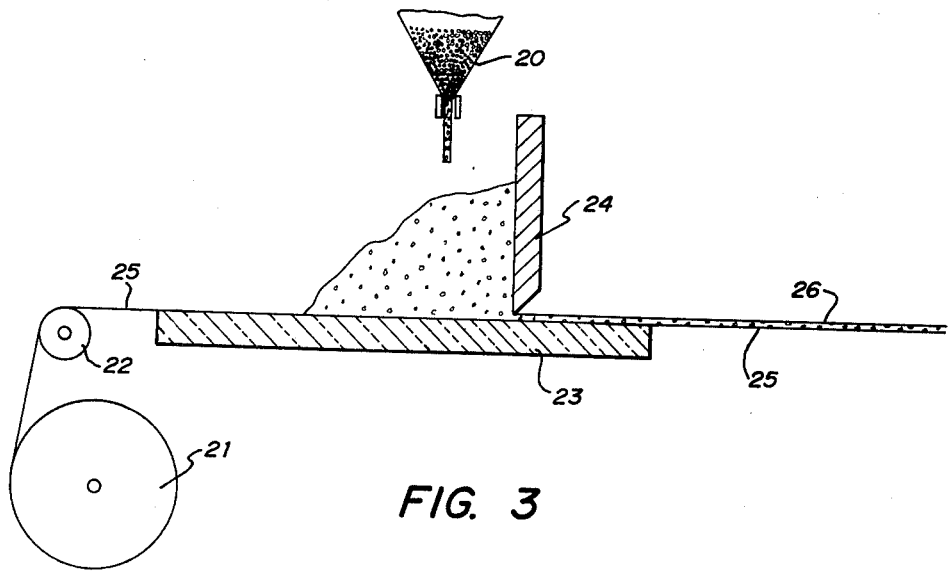
FIG. 3 illustrates the formation of a glass sheet with semiconductor spheres distributed through the slurry from which the sheet is formed.

Depending upon the equipment available for further processing, strip 26, FIG. 3, may be cut into pieces of desired size after air drying and before firing in order to facilitate handling in subsequent operations.

Step C—Back Etch

Figure 4:
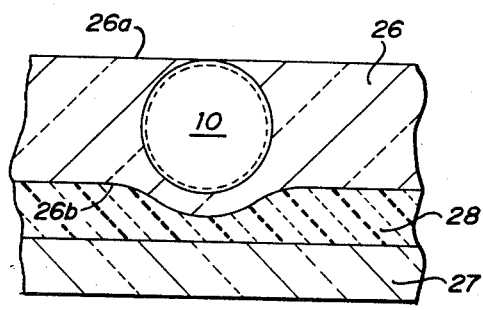
FIGS. 4–11 illustrate the successive steps of FIG. 2 in producing the converter of FIG. 1.
Figure 5:
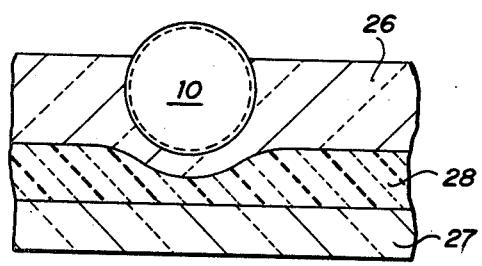

Referring to FIG. 4, sheet 26 with sphere 10 therein is shown with the side 26a that was in contact with the Mylar sheet up and with the opposite side 26b down. Preparatory to etching the side 26a, the side 26b is mounted onto a glass plate 27 by a layer of beeswax 28. Thus mounted, sheet 26 is then immersed in concentrated hydrofluoric acid for a period of two minutes. It is then removed and is rinsed in flowing deionized water for one minute. The etch by hydrofluoric acid removes the glass at surface 26a so that the upper portion of the sphere 10 is exposed as in FIG. 5.

Thereafter, the unit is immersed for ten seconds in a silicon etch compound. A suitable etchant is of the type identified as 39-A etch and comprises 15% acetic acid, 25% hydrofluoric acid and 60% nitric acid (weight percent). Thereafter, the unit is rinsed in deionized water for five minutes in each of three separate rinse stages. The unit thus is of the form illustrated in FIG. 6 after demounting from the glass-beeswax support 27, 28.

Step D—Glass Fill

Figure 6:
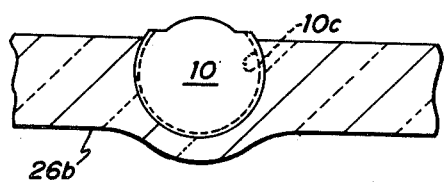

The unit illustrated in FIG. 6 has had the surface layer of sphere 10 adjacent to side 26a removed to expose the junction 10c.

Figure 7:
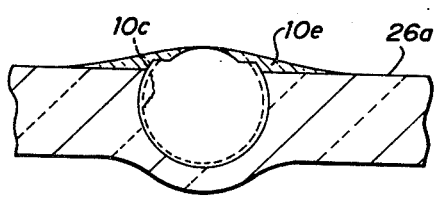

In a reglass step illustrated in FIG. 7, a small quantity of glass is provided to form a ring 10e which covers the exposed junction 10c. This may be accomplished by utilizing a passivating glass material, i.e., a glass powder of the type manufactured and sold by Innotech Corporation of Norwalk, Conn. and identified as their 745 glass. The glass powder, suspended in water, is applied to the side 26a and is spread over side 26a, as with a doctor blade, to distribute the water suspension of glass over the exposed sphere. Preferably, the unit is then air dried and a similar water suspension is again placed on side 26a and distributed. The unit then preferably is placed on a warm surface at about 40° to 50° C. with side 26a up. Preferably, this results in sphere 10 being covered at the margin where it emerges from surface 26a but exposed at the top portion.

The unit thus prepared is placed in the chain furnace as above described in connection with the firing step, but with the peak temperature set at about 750° C. to fuse the passivating glass which covers the junction 10c.

Step E—Contact

The unit, as taken from the furnace in step D and after being cooled, is then placed for fifteen seconds in a 10% hydrofluoric acid solution. It is then rinsed for five minutes in each of three stages of deionized water. The unit is then dried in a hot nitrogen dry box preparatory to applying the common metal electrode 13.

Step F—Metallize

Figure 8:
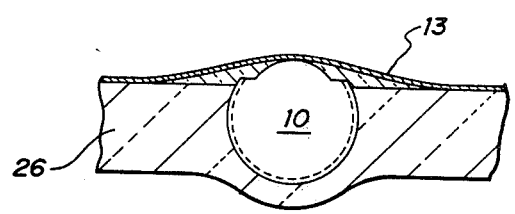

As illustrated in FIG. 8, metal layer 13 is then applied by sputtering or by evaporation. Metal layer 13 is preferably of titanium and a layer about 2,000 angstroms thick is applied by vacuum evaporation. It serves to provide a common electrical terminal for all of the body portions of all of the spheres in the layer 26. Other metals such as tungsten or molybdenum may also be used for this contact. The material chosen must be inert in the chosen electrolyte and preferably should have a substantial overvoltage with respect to it.

Step G—Front Etch

Figure 9:
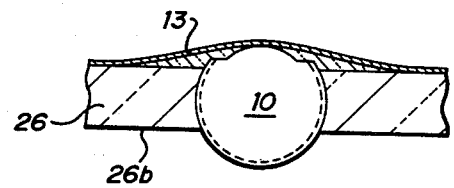

As illustrated in FIG. 9, after covering electrode 13 with a suitable masking material, the side 26b of the sheet 26 is then etched in concentrated hydrofluoric acid for 1.5 minutes. The masking material is then removed and the sheet 26 is then rinsed for about five minutes in each of three stages of deionized water and dried. This step serves to remove a portion of the glass and oxide which cover portions of the sphere opposite the contact with the layer 13. The resulting structure is as shown in FIG. 9.

Step H—Platinum Sputter

Figure 10:
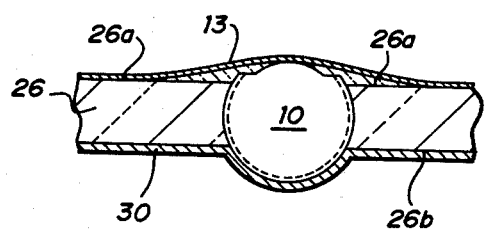

As shown in FIG. 10, a layer 30 of platinum is applied to the surface 26b. Prior to doing this, however, the unit is placed in 10% hydrofluoric acid for three seconds and is then rinsed in deionized water and dried. The platinum is sputtered on the front side 26b to provide a layer of about 75 angstroms thick. The unit is then mounted on glass with beeswax (not shown) with the side 26a down. The unit is then dipped in 10% hydrofluoric acid for ten seconds and transferred immediately to a strong stream of running deionized water. This serves to strip off portions of the layer 30 other than over the sphere. Thus electrode 10d is formed. Electrodes 10d are of such thickness that they are transparent and yet serve to protect the silicon sphere 10 from any oxidation that might be due to elements in which the unit is placed. The unit is then demounted from the glass-beeswax combination and is cleaned as by placing in boiling perchloroethylene for ten minutes and then in boiling isopropyl alcohol for five minutes. It is then air dried and is ready for use.

Figure 11:
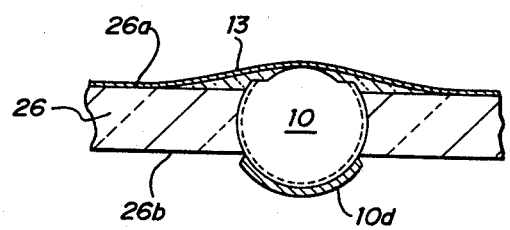

In the structure shown in FIG. 11, the glass sheet 26 is of extending area and many spheres of p-type bodies and of n-type bodies are employed. Such units may be placed within an electrolyte with the electrodes, such as electrode 10d, in contact with the electrolyte and facing a source of light. The diodes will thus be activated to produce voltages between terminals 10d and 13. For silicon cells, the voltage produced per unit is about 0.4 to 0.6 volt. As in FIG. 1, diodes having p-type bodies are connected in series with diodes having n-type bodies. Thus the resultant voltage effective on the electrolyte is the sum of the voltages from any pair of diodes.

In the system illustrated in FIG. 3, the diodes are supplied in the slurry in such quantity as to provide an optimum density in the sheet 26, FIG. 3. In such case, however, the distribution will be entirely random both as to spacing and as to the sites of diodes of p-type bodies and the sites of diodes of n-type bodies. This results from mixing the spheres with the glass slurry and casting it as a ceramic tape would be cast.

Figure 12:
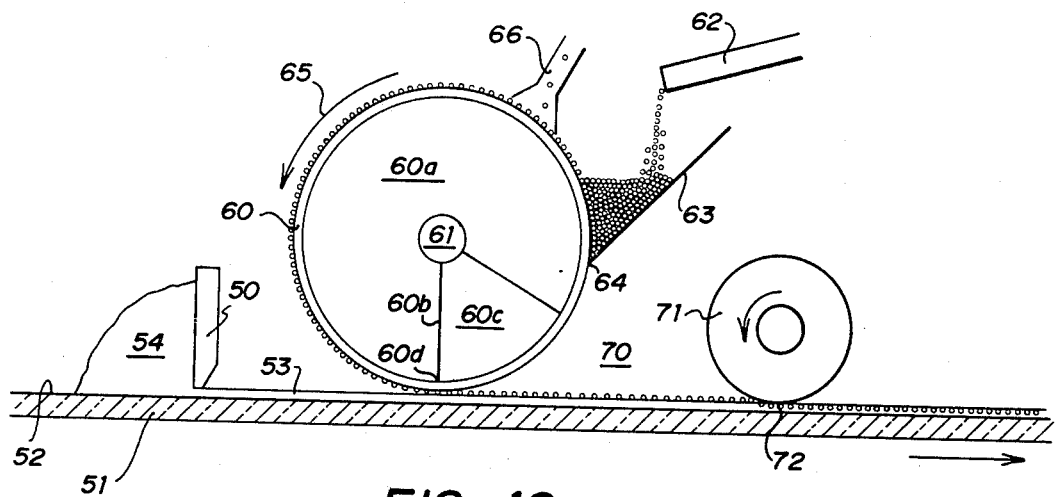
FIG. 12 illustrates a modified form of casting semiconductor particles in a glass sheet.

Some advantage both in processing and performance of a converter may be realized by arranging the spheres in a regular uniform spaced pattern, i.e., in square or hexagonal close-packed relationships. To establish a regular uniformly spaced pattern of diodes in a glass matrix, the spheres, as shown in FIG. 12, are picked up in a vacuum pickup unit and transferred to a freshly cast glass slurry tape. In FIG. 12, a continuously fed tape casting head includes a doctor blade 50 positioned above a bed 51. The casting head is employed, as in FIG. 3, with a carrier sheet 52 to cause a tape 53 to be cast on carrier 52 from a continuously fed supply of slurry 54. Slurry 54 does not have the spheres therein.

Immediately downstream of the doctor blade 50, a transfer drum 60 is mounted on a shaft 61 and is driven such that the peripheral speed is the same as the speed of the carrier 52. Carrier 52 passes immediately under the drum 60. Drum 60 has a surface perforated by an array of small holes. A vacuum is applied to the inner segment 60a. A baffle plate 60b marks the boundary of a vacuum release segment 60c. A continuous supply of spheres is provided by controlled flow thereof through a nozzle 62. The spheres fall from nozzle 62 onto a baffle plate 63 which is tilted downward toward and in rub fit with the surface of drum 60 at point 64. With a vacuum applied to the segment 60a through holes in the drum 60, spheres lying on the baffle plate 63 become attached at the sites of holes in drum 60 and are carried upward as the drum rotates in the direction of arrow 65. A vacuum station 66 removes any excess spheres from the surface of drum 60 and deposits them back into the supply. Spheres are carried by drum 60 and reach a release point 60d at which point the vacuum is released by a vacuum-release wedge as the spheres engage the cast slurry tape 53. The spheres are released and are carried through the zone 70 towards an embedding roller 71 which forces spheres resting on top of the cast tape 53 downward and into the tape as illustrated at 72. Thereafter, the tape issuing from point 72 may be handled in the manner above described.

Figure 13:
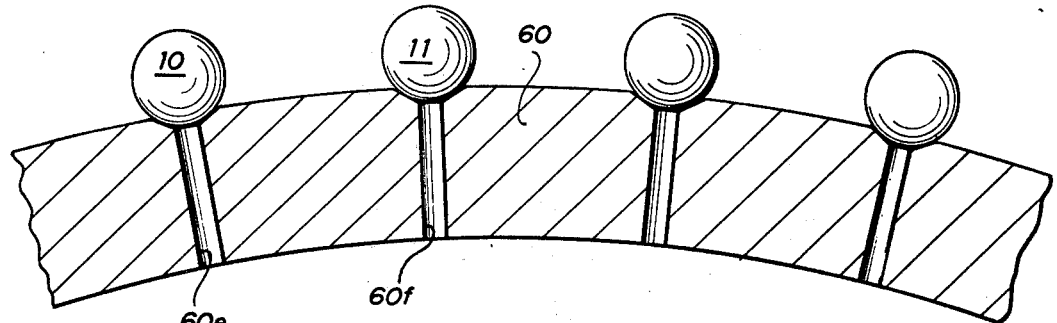
FIG. 13 is an enlarged sectional view of the drum 60 of FIG. 12.

The distribution of the spheres in the tape as it emerges from the system of FIG. 12 may be of any selected character, depending upon the geometry of the pattern of holes in the face of the drum 60. As indicated in FIG. 13, drum 60 is provided with a plurality of small passageways 60e, 60f with each having chamfered terminations at the outer surface of the drum 60. By applying a vacuum inside drum 60, the spheres 10 and 11 would then be drawn onto the drum, one per opening, and carried by the drum to the point 60d of release at which point the portions of the spheres facing away from the drum surface would be wet in the upper surface of the cast tape 53 and would then be carried away from drum 60 towards roller 71 by movement of the cast tape 53. The spheres supplied through the nozzle 62 would be of substantially equal parts of spheres having p-type bodies and spheres having n-type bodies.

Figure 14:
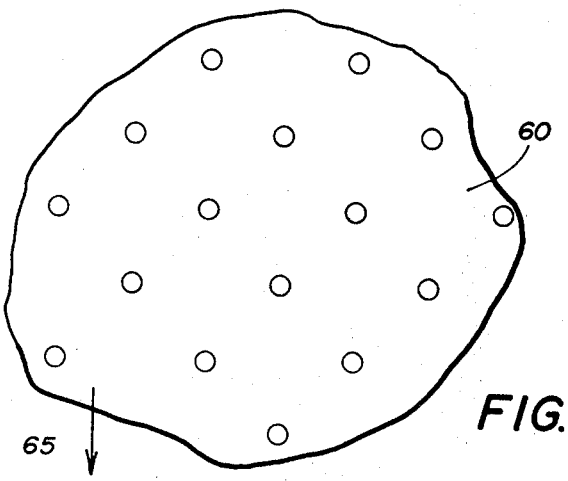
FIG. 14 is a view of one pattern of spheres planted by use of units such as drum 60 of FIG. 12.

In a preferred form, the spheres of about 0.010 inch in diameter would be spaced apart on centers of about 4 radii. Preferably they would be arrayed in a grid as shown in FIG. 14.

In other embodiments described in said U.S. Pat. No. 4,021,323, the voltage produced by a single cell is sufficient for electrolysis. In this case all of the spheres may be of the same conductivity type, i.e., n-type or p-type. Such spheres may be cast into a sheet in the manner previously described.

In this case, one electrode is located on the back surface of the glass sheet, while the second electrode is formed at the front surface. Noble metals such as platinum are desirable for both electrodes, and the back electrode may be applied by the sputtering process of step H.

Although the foregoing discussion has been described in terms of spheres with diffused PN junctions, it should be noted that other processes may be used. U.S. Pat. No. 4,021,323 makes it clear that Schottky barrier devices, MIS devices and hetrojunctions can all be used as the power source. Similarly other semiconducting materials such as germanium, gallium arsenide or gallium phosphide may be used as the starting material.

It will also be understood that the operations above described may be employed in production of monolayer arrays of semiconductor light emitting diodes for display purposes and the like.

Having described the invention in connection with certain specific embodiments thereof, it is to be understood that further modifications may now suggest themselves to those skilled in the art and it is intended to cover such modifications as fall within the scope of the appended claims.

What is claimed is:

1. The method of forming a distributed semiconductor unit which comprises:
    (a) forming semiconductor particles of substantially uniform size, each having a central body portion inside a surface layer and a PN junction therebetween;
    (b) casting said particles as a monolayer in a sheet of glass slurry of thickness corresponding to about the thickness of said particles;
    (c) fusing said glass to rigidify the glass as a sheet with said particles distributed thereon with the surface layers of said particles exposed on one side of said sheet and the body portion exposed on the other side of said sheet; and
    (d) applying a metal layer on one side of said sheet in contact with the body portion of each of said particles and isolated from the junction between said surface layer and said body portion.

2. The method of claim 1 in which said particles are cast in a random array.

3. The method of claim 1 in which said particles are cast in a regular ordered array.

4. The method for forming a distributed semiconductor unit which comprises:
    (a) forming body portions of semiconductor particles of one conductivity type and of substantially uniform size;
    (b) establishing a surface layer on each body portion of said particles said surface layers of a second conductivity type with a PN junction between the body portion and surface layer of each said particle;
    (c) casting said particles as a monolayer in a sheet of glass slurry of thickness corresponding to about the thickness of said particles;
    (d) fusing said glass to rigidify the glass as a sheet with said particles distributed therein and with the surface layer of said particles exposed on both sides of said sheet;
    (e) removing part of each said particle on one side of said sheet to a point inside said junction to expose the body portion of each said particle;
    (f) applying glass to cover the junction and said surface layer exposed after the removal of each said part;
    (g) applying a metal layer on said one side of said sheet to contact and interconnect the body portions of all said particles; and
    (h) applying transparent metallic electrodes to cover the surface layer of each said particle exposed at the side of said sheet opposite said metal layer, each said electrode being isolated from every other electrode.

5. The method of claim 4 in which said particles are cast in a random array.

6. The method of claim 4 in which said particles are cast in a regular ordered array.

7. The method of claim 4 in which an electrode is applied to each of said particles on the side of said sheet opposite said metal layer.

8. The method of claim 4 in which about half of said particles have body portions of said one conductivity type and in which about half of said particles have body portions of said opposite conductivity type.

* * * * *

UNITED STATES PATENT AND TRADEMARK OFFICE
CERTIFICATE OF CORRECTION

PATENT NO. : 4,270,263

DATED : June 2, 1981

INVENTOR(S) : Elwin L. Johnson et al

It is certified that error appears in the above—identified patent and that said Letters Patent is hereby corrected as shown below:

Column 3, line 48 (page 8, line 9), change "application Serial No. 599,473" to -- U.S. Patent No. 4,021,323 --.

Column 3, line 59 (page 8, line 18), change "application Serial No. 599,473" to -- U.S. Patent No. 4,021,323 --.

Signed and Sealed this

Eighteenth Day of August 1981

[SEAL]

Attest:

GERALD J. MOSSINGHOFF

Attesting Officer

Commissioner of Patents and Trademarks